(12) United States Patent
Geng

(10) Patent No.: US 9,729,110 B2
(45) Date of Patent: Aug. 8, 2017

(54) RADIO-FREQUENCY DEVICE CALIBRATION

(71) Applicant: QUALCOMM Incorporated, San Diego, CA (US)

(72) Inventor: Jifeng Geng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/205,265

(22) Filed: Mar. 11, 2014

(65) Prior Publication Data

US 2014/0292404 A1    Oct. 2, 2014

Related U.S. Application Data

(60) Provisional application No. 61/805,839, filed on Mar. 27, 2013.

(51) Int. Cl.
| | |
|---|---|
| *H03F 1/32* | (2006.01) |
| *H03F 3/189* | (2006.01) |
| *H03F 3/20* | (2006.01) |
| *H03F 1/02* | (2006.01) |

(52) U.S. Cl.
CPC ......... *H03F 1/3241* (2013.01); *H03F 1/0211* (2013.01); *H03F 1/3247* (2013.01); *H03F 3/189* (2013.01); *H03F 3/20* (2013.01)

(58) Field of Classification Search
USPC ................ 330/149; 375/296–297; 455/114.3
See application file for complete search history.

(56) References Cited

U.S. PATENT DOCUMENTS

| | | | |
|---|---|---|---|
| 6,246,286 B1 * | 6/2001 | Persson ................ | H03F 1/3241 330/136 |
| 6,646,501 B1 * | 11/2003 | Wessel ............................ | 330/10 |
| 6,985,704 B2 | 1/2006 | Yang et al. | |
| 7,145,390 B2 | 12/2006 | Pan | |

(Continued)

FOREIGN PATENT DOCUMENTS

| | | |
|---|---|---|
| CN | 1663115 A | 8/2005 |
| CN | 101247153 A | 8/2008 |

(Continued)

OTHER PUBLICATIONS

Harju H., et al., "Envelope Tracking Power Amplifier with Static Predistortion Linearization," 18th European Conference on Circuit Theory and Design, ECCTD, Piscataway, NJ, USA, Aug. 27, 2007 (Aug. 27, 2007), pp. 388-391, XP031257765, ISBN: 978-1-4244-1341-6, figures 1-3,5.

(Continued)

*Primary Examiner* — Hieu Nguyen
(74) *Attorney, Agent, or Firm* — Arent Fox, LLP and Qualcomm Incorporated

(57) ABSTRACT

Exemplary embodiments are related to method and devices for calibration a radio-frequency (RF) transceiver. A method may include calibrating an RF device by calculating input voltage values and bias voltage values of a power amplifier for each desired output voltage value of the power amplifier to generate a desired compression point. The method may also include applying digital pre-distortion (DPD) values to the input voltage of the power amplifier, and measuring a value of the output voltage after applying the DPD values.

27 Claims, 7 Drawing Sheets

(56) References Cited

U.S. PATENT DOCUMENTS

| | | | |
|---|---|---|---|
| 7,340,223 B1 | 3/2008 | Wright et al. | |
| 7,715,811 B2 * | 5/2010 | Kenington | 455/127.1 |
| 7,957,707 B2 | 6/2011 | Staudinger et al. | |
| 8,364,101 B2 | 1/2013 | Shizawa et al. | |
| 8,433,263 B2 * | 4/2013 | Pratt | H03F 1/3247 330/149 |
| 9,041,464 B2 * | 5/2015 | Komninakis | H03F 1/3247 330/149 |
| 2009/0256630 A1 | 10/2009 | Brobston | |
| 2010/0194476 A1 | 8/2010 | Drogi et al. | |

FOREIGN PATENT DOCUMENTS

| | | |
|---|---|---|
| CN | 101379697 A | 3/2009 |
| WO | 2013040505 A1 | 3/2013 |

OTHER PUBLICATIONS

International Search Report and Written Opinion—PCT/US2014/024913—ISA/EPO—Jun. 25, 2014.

* cited by examiner

RADIO-FREQUENCY DEVICE CALIBRATION

CROSS-REFERENCE TO RELATED APPLICATIONS

This application claims the benefit of priority under 35 U.S.C. §119(e) to U.S. Provisional Patent Application No. 61/805,839, titled "MLINE FOR XPT CALIBRATION," filed on Mar. 27, 2013, the entire disclosure of which is, by this reference, incorporated herein

BACKGROUND

Field

The present invention relates generally to calibration of a radio-frequency (RF) transmitter. More specifically, the present invention relates to embodiments for calibrating a power amplifier device with digital pre-distortion.

Background

Electronic amplifiers are used for increasing a power and/or an amplitude of various electronic signals. Most electronic amplifiers operate by using power from a power supply, and controlling an output signal to match the shape of an input signal, while providing a higher amplitude signal.

One widely used type of electronic amplifier is a power amplifier, which is a versatile device used in various applications to meet design requirements for signal conditioning, special transfer functions, analog instrumentation, and analog computation, among others. Power amplifiers are often used in wireless applications, and may employ RF amplifier designs for use in the RF range of the electromagnetic spectrum. An RF power amplifier is a type of electronic amplifier used to convert a low-power RF signal into a signal of significant power, typically for driving an antenna of a transmitter. RF power amplifiers are oftentimes used to increase the range of a wireless communication system by increasing the output power of a transmitter.

Power amplifiers, typically, do not behave in a linear manner. More particularly, power amplifier distortion may compress or may expand an output signal swing of a power amplifier. Signal detectors receiving and decoding the amplified signals typically do not operate in such a non-linear fashion. Therefore, it is usually necessary to linearize an output of a power amplifier. One approach to such linearization is digital pre-distortion (DPD). DPD may be calibrated and used with power amplifiers to invert power amplifier distortion characteristics by expanding compression regions and compressing expansion regions of power amplifier characteristics.

A need exists for calibrating a power amplifier digital pre-distortion device. More specifically, a need exists for embodiments related to calibrating a power amplifier digital pre-distortion device based a non-linearity characterization of the power amplifier digital pre-distortion device.

DETAILED DESCRIPTION

Figure 1:
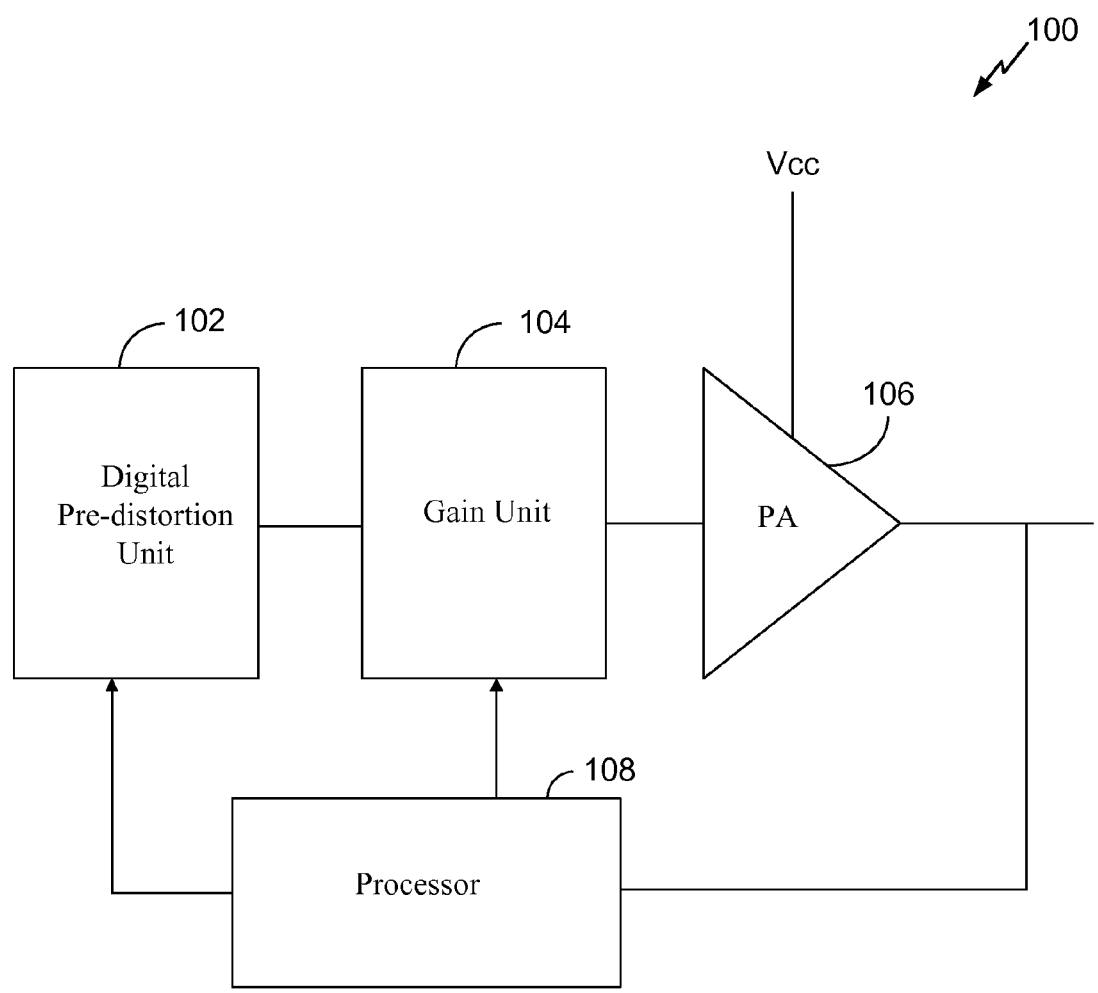
FIG. 1 illustrates a power amplifier digital pre-distortion device including a digital pre-distortion unit, a gain unit, a power amplifier, and a processor.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Conventional power amplifiers are generally adapted to use one or more of a plurality of control technologies. One control technology may include a battery, which is directly connected to a supply port of a power amplifier. This may be efficient at times when maximum power is needed, but at lower power levels, efficiency drops rapidly because a full battery voltage may not be necessary. Another control technology includes average power tracking (APT), which uses a switch, coupled between a battery and a power amplifier, and an algorithm to change voltage between various power control groups. Compared to the battery direct technology, at lower powers, APT exhibits improved efficiency since a power amplifier voltage may be correspondingly decreased. Another control technology, which is an enhanced APT, is EPT, further lowers the supply voltage while using DPD. Yet another configuration uses an algorithm to change a supply voltage per various power control groups. This control technology may also use DPD and adaptiveness to adjust the supply voltage to one or more limits. Moreover, a control technology referred to as envelope tracking (ET) uses a separate chipset to track an envelope of a power amplifier input signal at high speed and high precision. ET may require a power amplifier to be optimized for ET usage and also may require an ET digital-to-analog converter (DAC) (e.g., within a mobile station modem (MSM)).

As will be understood by a person having ordinary skill in the art, each power amplifier control technology may have a target compression value, which may also be referred to as a target compression point. Typically, APT has a target compression value of 1.5 dB, EPT has a target compression value of 2 dB, and ET has a target compression value of 3 dB. Further, one or more other control technologies may have a target compression value of 2 dB.

As will be appreciated by a person having ordinary skill in the art, a conventional method of characterizing a power amplifier digital pre-distortion device may include measuring a few parts (i.e., a few amplifiers of a batch), and using an average of the parts, or a worst case scenario. However, as will be appreciated, this method suffers due to a power amplifier's part-to-part amplitude modulation-to-amplitude modulation (AM-AM) variation and/or amplitude modulation-to-phase modulation (AM-PM) variation.

Exemplary embodiments of the present invention include embodiments for determining a relationship among three variables (i.e., input voltage Vin, output voltage Vout, and bias voltage Vcc) of a power amplifier based on a desired compression point for the power amplifier. The relationship data may then be used for determining a power amplifier's AM-AM per part. Further, based on the relationship, a gain index, which controls a power amplifier input voltage level, and voltage level of a bias signal ("bias voltage") conveyed to the power amplifier (i.e., power amplifier bias voltage) for each desired power level of a signal output by the power amplifier (i.e., a power amplifier output voltage) may be calculated. The relationship data may be shared among a plurality of control technologies.

More specifically, according to various exemplary embodiments, a device may include a power amplifier configured to receive an input voltage and a bias voltage and convey an output voltage. The device may also include a processor coupled to the power amplifier and configured to sense a plurality of in-phase and quadrature (IQ) samples conveyed by the power amplifier at a plurality of input voltages and bias voltages conveyed to the power amplifier. The processor may also be configured to generate a plurality of AM-AM curves from the plurality of sensed IQ samples. Moreover, the processor may be configured to determine a relationship among the input voltage, the bias voltage, and the output voltage based on target compression point on each curve for each power amplifier control technology. The processor may further be configured to determine, based on the relationship, two of the input voltage, the bias voltage, and the output voltage to reach the target compression point based on a known value for one of the input voltage, bias voltage, and the output voltage.

According to yet another exemplary embodiment, the present invention includes methods for calibrating a power amplifier digital pre-distortion device. Various embodiments of such a method may include calibrating an RF device by calculating input voltage values and bias voltage values of a power amplifier for each desired output voltage value of the power amplifier to generate a desired compression point. The method may also include applying DPD values to the input voltage of the power amplifier, and measuring a value of the output voltage after applying the DPD values.

According to another exemplary embodiment, a method may include sensing a plurality of IQ samples conveyed by the power amplifier at a plurality of input voltages and bias voltages conveyed to the power amplifier. In addition, the method may include generating a plurality of AM-AM curves from the plurality of sensed IQ samples. The method may further include determining a relationship among the input voltage, the bias voltage, and the output voltage based on target compression point on each curve for each power amplifier control technology. Moreover, the method may include determining, based on the relationship, two of the input voltage, the bias voltage, and the output voltage to reach the target compression point based on a known value for one of the input voltage, bias voltage, and the output voltage.

Other aspects, as well as features and advantages of various aspects, of the present invention will become apparent to those of skill in the art through consideration of the ensuing description, the accompanying drawings and the appended claims.

Figure 2:
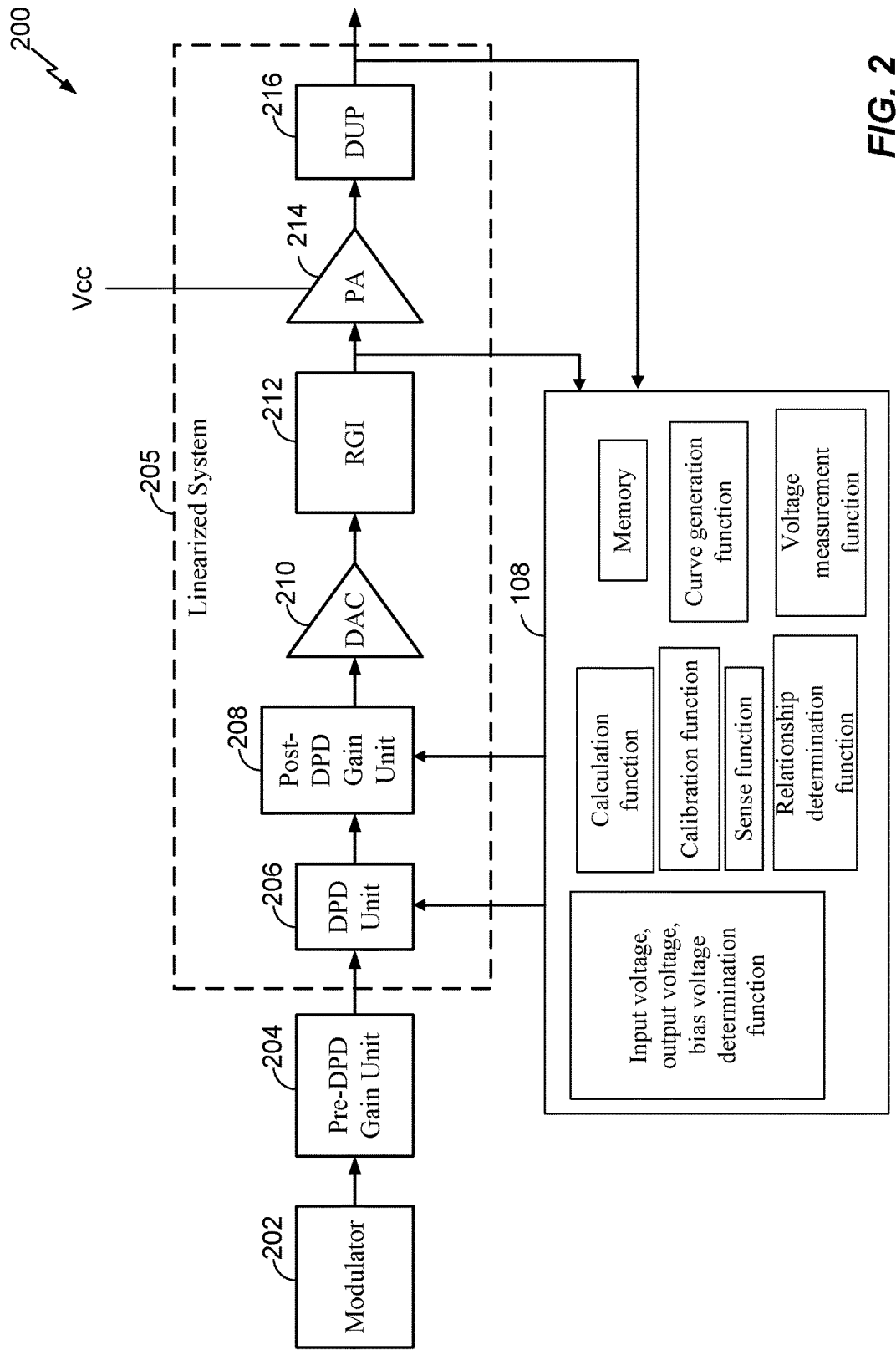
FIG. 2 depicts a more detailed illustration of a power amplifier digital pre-distortion device.

FIG. 1 illustrates a device 100 including a DPD unit 102, gain unit 104, a power amplifier 106, and a processor 108. It is noted that device 100 is an example of a power amplifier digital pre-distortion device, which may be used for carrying out one or more of the various methods described herein. FIG. 2 depicts a device 200, which is a more detailed example of a power amplifier digital pre-distortion device that may be used for carrying out one or more of the various methods described herein. Device 200 includes a modulator 202, a pre-DPD gain unit 204, and a linearized system 205. Linearized system 205 includes a DPD unit 206, a post-DPD gain unit 208, a digital-to-analog converter (DAC) 210, an RF gain index 212, a power amplifier 214, and a duplexer 216. Power amplifier 214 may be configured to receive an input voltage and a bias voltage, and output an output voltage.

According to one exemplary embodiment, post-DPD gain unit 208, RF gain index 212, or both, may be varied to modify a power level of a signal received by power amplifier 214. Device 200 may further include a processor 108 for receiving an output of duplexer 216 controlling an operation of one or more of the components of device 200. According to one example, processor 108 may be configured for capturing IQ samples at a plurality of input and bias voltages (e.g., input voltages of the power amplifier 214 and voltages for biasing the power amplifier 214). As a more specific example, processor 108 may include a DPD capture unit (not shown in FIG. 2) configured for capturing IQ samples. It is noted that processor 108 may include one or more memory devices for storing data related to calibration of a device 100/200, as described herein.

According to one embodiment, during calibration of a power amplifier digital pre-distortion device (e.g., device 100 of FIG. 1), a plurality of IQ samples may be captured at a various input and bias voltages. For example, a plurality of IQ samples may be captured at four predetermined voltage combinations (i.e., power amplifier input voltage and bias voltage combinations). Further, each IQ capture may result in an AM-AM curve on a plot. More specifically, if a processor captures four IQ samples, the processor may generate a plot including four AM-AM curves, wherein each curve is associated with a specific bias voltage. In addition, a desired compression point on each AM-AM curve may be identified, and the plot may be scaled by extending a line linearly through each compression point to identify additional AM-AM curves. More specifically, as long as the plot includes at least two AM-AM curves, wherein each curve includes a desired compression, the plot may be scaled to include more than the two AM-AM curves.

Furthermore, using the plot, the power amplifier digital pre-distortion device may be calibrated by determining a relationship among the input voltage of a power amplifier (e.g., power amplifier 214), the output voltage of the power amplifier, and the bias voltage of the power amplifier. For example, capturing a plurality of IQ samples, generating a plurality of AM-AM curves on a plot, and scaling the plot along a linear line extending through desired compression points may result in a three-dimensional plot 300, as illustrated in FIG. 3.

Figure 3:
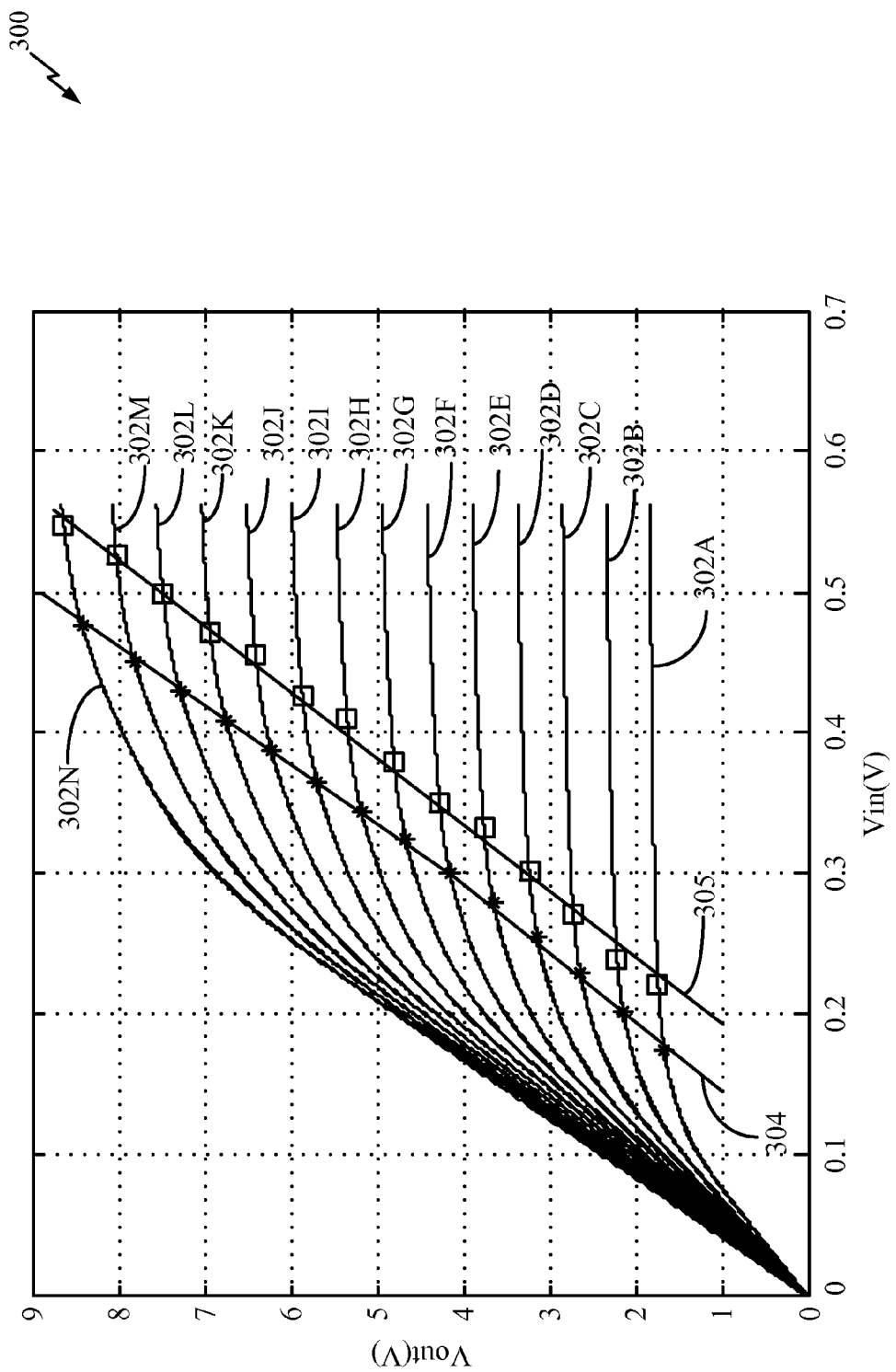
FIG. 3 is a plot illustrating desired compression points for a plurality of power amplifier technologies on amplitude modulation-to-amplitude modulation curves according to input voltages, output voltages, and bias voltages.

With reference to FIG. 3, three-dimensional plot 300 illustrates desired compression points ("stars" for a first power amplifier technology (e.g., EPT) and "squares" for a second, different power amplifier technology (e.g., ET)) on AM-AM curves for given a given input voltage (Vin), output voltage (Vout), and bias voltage. More specifically, plot 300 includes a plurality of curves 302A-N, wherein a y-axis represents the output voltage Vout, an x-axis represents the input voltage Vin, and each separate curve relates to a bias voltage. For example, a curve designated by reference numeral 302A relates to a bias voltage of 1.0 volt, a curve designated by reference numeral 302B relates to a bias voltage of 1.2 volts, a curve designated by reference numeral 302C related to a bias voltage of 1.4 volts, and a curve designated by reference numeral 302D related to a bias voltage of 1.6 volts. Further, curves 302E-N respectively relate to bias voltages of 1.8 volts, 2.0 volts, 2.2 volts, 2.4 volts, 2.6 volts, 2.8 volts, 3.0 volts, 3.2 volts, 3.4 volts, and 3.6 volts, respectively.

Plot 300 further includes a plurality of desired compression points for a given technology (e.g., EPT) that form a line 304, which extends linearly across the curves 302A-N and establishes a relationship among three variables (i.e., input voltage Vin, output voltage Vout, and bias voltage Vcc). Using plot 300, two of the three variables may be determined based on a known value of one of the variables for a given technology to reach a desired compression point. More specifically, as one example, for the first power amplifier control technology (e.g., EPT, represented by "stars") if a known output voltage is substantially equal to 7.0 volts, using line 304 as a guide, it may be determined that the input voltage is substantially equal to 0.42 volts, and the bias voltage is substantially equal to 3.1 volts to reach a desired compression point for the first power amplifier control technology. As another example, if a known input voltage is substantially equal to 0.3 volts, using line 304 as a guide, it may be determined that the output voltage is substantially equal to 4.1 volts, and the bias voltage is substantially equal to 2.0 volts the first power amplifier control technology. As yet another example, if a known bias voltage is substantially equal to 1.2 volts, using line 304 as a guide, it may be determined that the input voltage is substantially equal to 0.2 volts, and the output voltage is substantially equal to 2.1 volts the first power amplifier control technology.

Plot 300 further includes a second plurality of desired compression points for another technology (e.g., ET) that form a line 305, which extends linearly across the curves 302A-N and establishes a relationship among three variables (i.e., input voltage Vin, output voltage Vout, and the bias voltage).

Moreover, an output power value after DPD can be accurately predicted. More specifically, after applying DPD, linearized system 205 may be become a linear system and the input may be represented by the output (e.g., the output may comprise a linear scaled version of the input). Thus, as will be appreciated by a person having ordinary skill in the art, the output power may be calculated without any knowledge of the DPD. Stated another way, for a desired output power level, a required input level and a required bias level may be determined.

Figure 4:
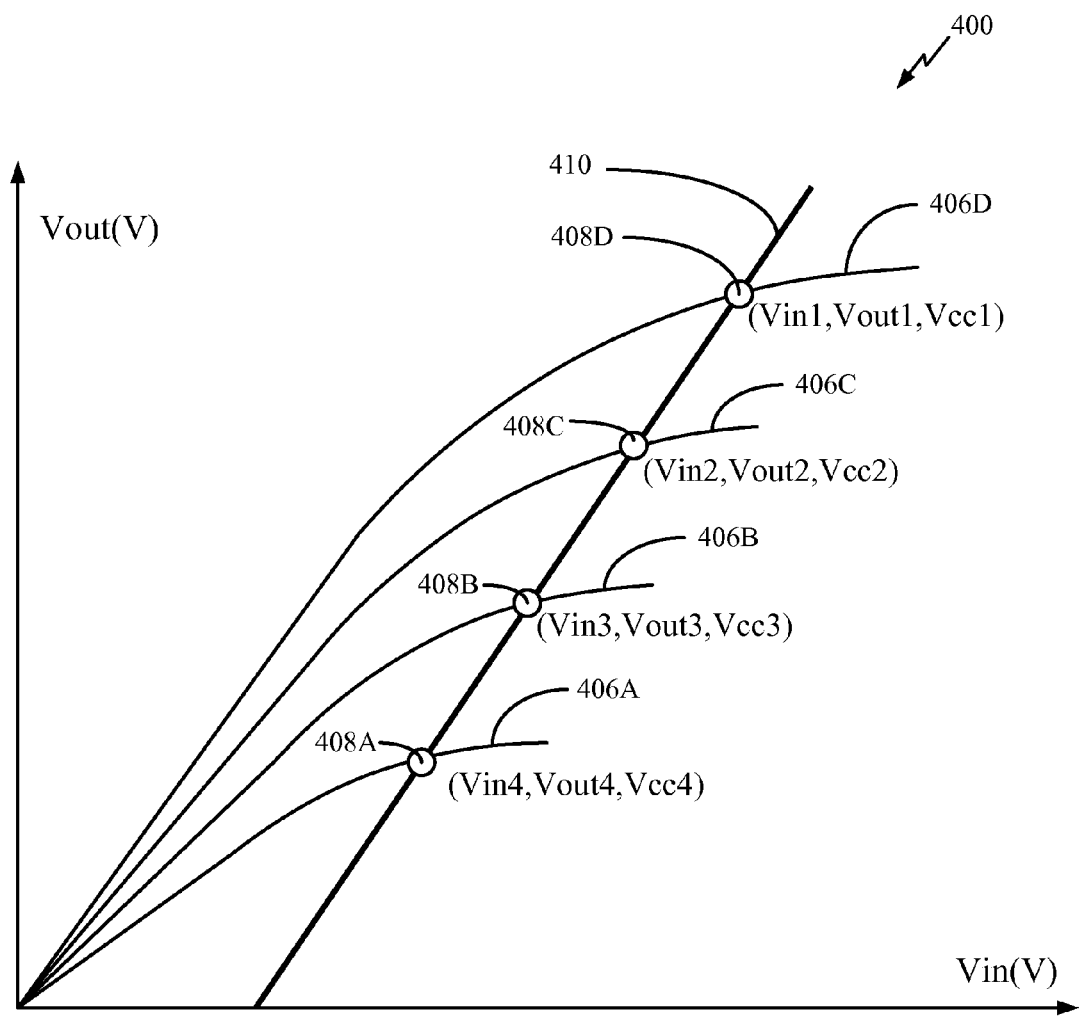
FIG. 4 is another plot illustrating a plurality of amplitude modulation to amplitude modulation curves and a line extending linearly across the amplitude modulation to amplitude modulation curves.

A more specific, contemplated method of calibrating a power amplifier digital pre-distortion device will now be described. During a first calibration sweep (e.g., an "alignment sweep"), a plurality of IQ samples may be captured at a plurality of pre-determined bias voltage Vcc and gain index combinations (e.g., four). With reference to FIG. 4 is a three-dimensional plot 400 illustrating four amplitude-to-amplitude (AM-AM) curves 406A-D. AM-AM curves (406A-D) are depicted for various supply voltage values (e.g., Vcc=1.8 volts for curve 406A, Vcc=2.4 volts for curve 406B, Vcc=3.0 volts for curve 406C, Vcc=3.6 volts for curve 406D). Further, for each AM-AM curve (406A-D), points (408A-D) may be found on the AM-AM curve. Each point 408A-D may represent a desired compression point on an associated curve for a specific power amplifier control technology. Plot 400 further includes a line 410 extending linearly across points 408A-D.

In addition, the first calibration sweep may include scaling a plot (e.g., plot 400) across a line including a plurality of desired compression points (e.g., line 410) to generate additional AM-AM curves across various bias voltages (e.g., as illustrated in plot 300 of FIG. 3. Using the line (e.g., line 410), a relationship between an input voltage, an output voltage, and a bias voltage for the control technology may be determined. Therefore, according to one exemplary embodiment, as noted above, required bias voltages and gain indices for desired output powers may be calculated to reach a desired compression point for a given control technology. It is noted that in response to determining the relationship, processor 108 (see FIG. 1 or 2) may adjust one or more of the bias voltage and the input voltage to provide the desired compression point and a desired output voltage. It is further noted that the methods described herein including determining input voltage and bias voltage values of a power amplifier for desired output voltage values to reach a desired compression point may be performed during device manufacture (e.g., at the factory).

During a second calibration sweep (e.g., a "digital pre-distortion sweep") input and bias levels may be applied and IQ samples may be captured and used to re-calculate AM-AM and/or amplitude modulation-to-phase modulation (AM-PM) distortion components, as will be appreciated by a person having ordinary skill in the art. An inverted AM-AM and AM-PM may be then be loaded into a DPD block. Furthermore, during a third calibration sweep (e.g., a "power sweep"), input and bias levels may be applied, DPD may be applied, and an output power level may be measured.

Figure 5:
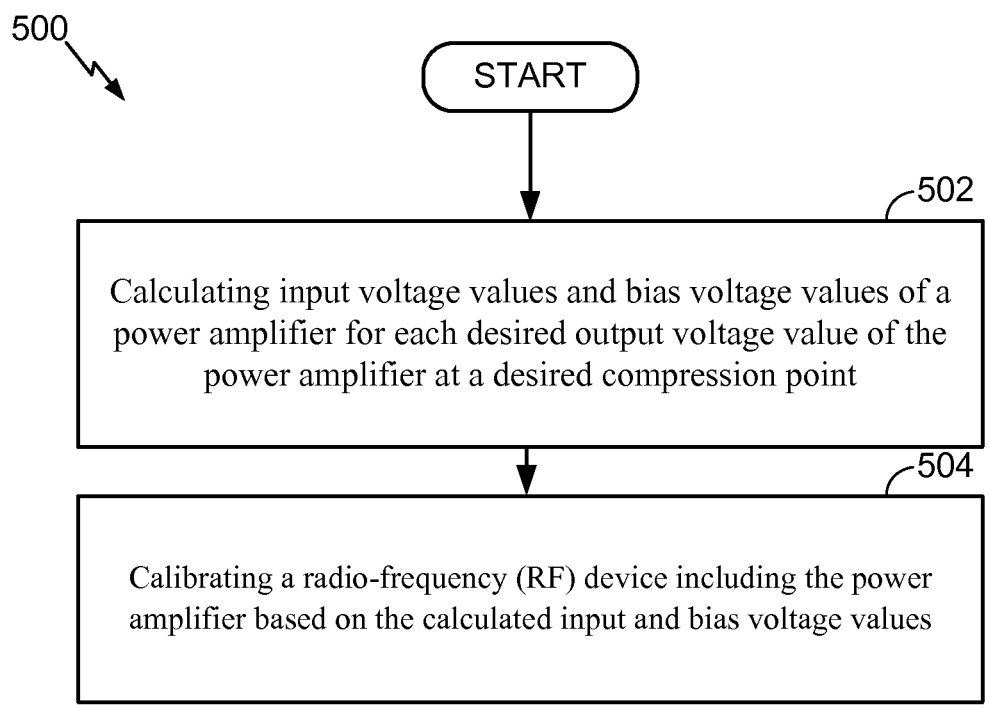
FIG. 5 is a flowchart depicting a method, in accordance with an exemplary embodiment of the present invention.

FIG. 5 is a flowchart illustrating a method 500, in accordance with one or more exemplary embodiments. Method 500 may include calculating input voltage values and bias voltage values of a power amplifier for each desired output voltage value of the power amplifier at a desired compression point (depicted by numeral 502). In addition, method 500 may include calibrating a radio-frequency (RF) device including the power amplifier based on the calculated input and bias voltage values (depicted by numeral 504).

Figure 6:
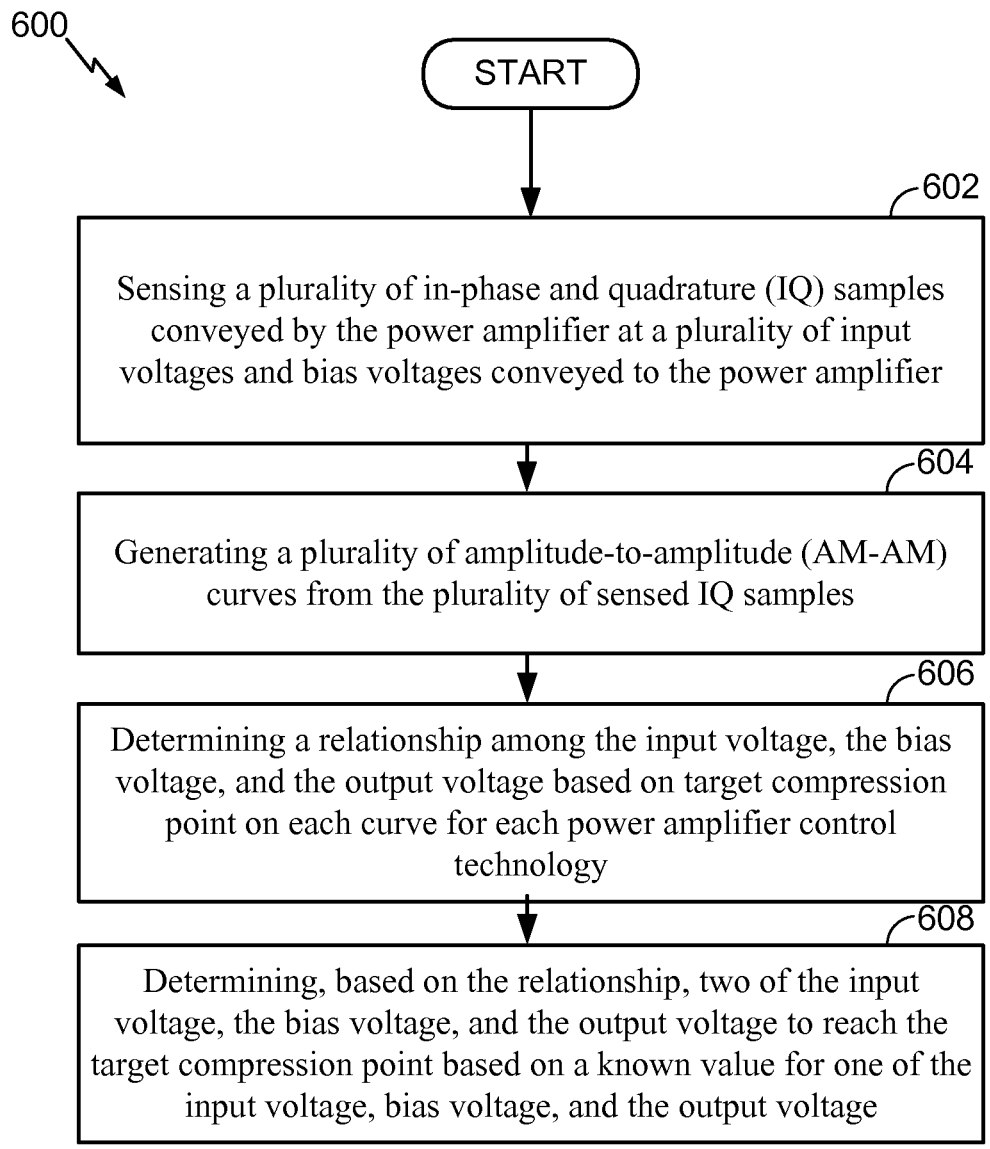
FIG. 6 is a flowchart depicting another method, according to an exemplary embodiment of the present invention.

FIG. 6 is a flowchart illustrating a method 600, in accordance with one or more exemplary embodiments. Method 600 may include sensing a plurality of IQ samples conveyed by the power amplifier at a plurality of input voltages and bias voltages conveyed to the power amplifier (depicted by numeral 602). In addition, method 600 may include generating a plurality of amplitude-to-amplitude (AM-AM) curves from the plurality of sensed IQ samples (depicted by numeral 604). Method 600 may also include determining a relationship among the input voltage, the bias voltage, and the output voltage based on target compression point on each curve for each power amplifier control technology (depicted by numeral 606). Furthermore, method 600 may include determining, based on the relationship, two of the input voltage, the bias voltage, and the output voltage to reach the target compression point based on a known value for one of the input voltage, bias voltage, and the output voltage (depicted by numeral 608).

Exemplary embodiments of the present invention, as disclosed herein enable the AM-AM on each power amplifier part to be determined. Further, there is no need for characterization, which may be required be conventional methods. In addition, exemplary embodiments provide for accurate identification of compression points, enhanced efficiency and accurate output power prediction after DPD. Moreover, exemplary embodiments may reduce calibration time as compared to conventional methods.

Figure 7:
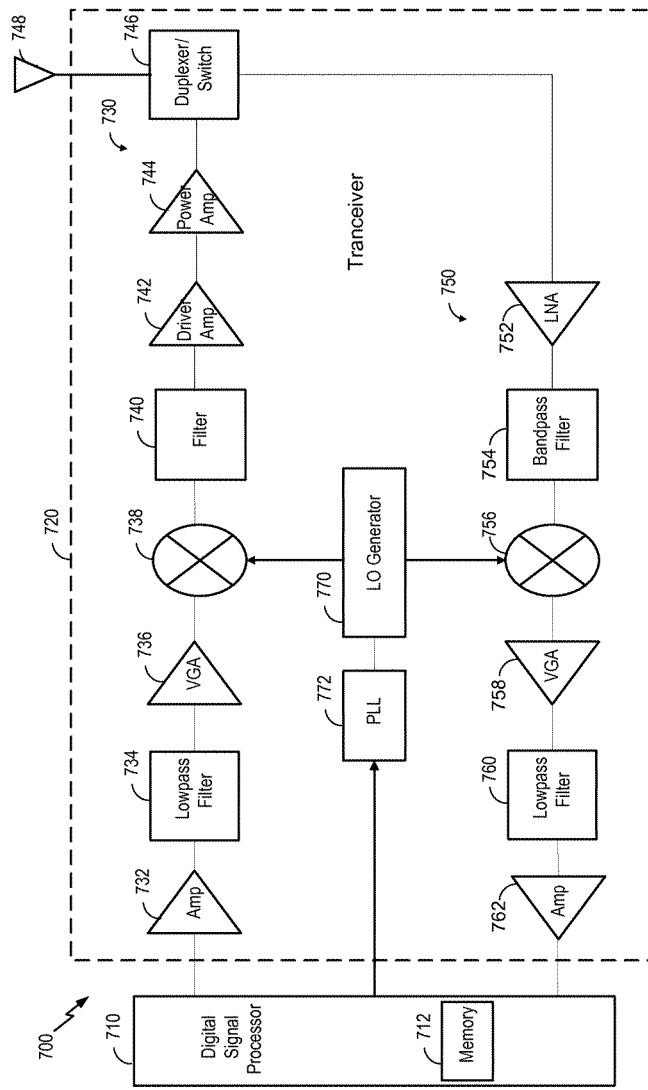
FIG. 7 illustrates a wireless communication device including a transceiver, in accordance with an exemplary embodiment of the present invention.

FIG. 7 shows a block diagram of an exemplary design of a wireless communication device 700. In this exemplary design, wireless device 700 includes a data processor 710 and a transceiver 720. Transceiver 720 includes a transmitter 730 and a receiver 750 that support bi-directional wireless communication. In general, wireless device 700 may include any number of transmitters and any number of receivers for any number of communication systems and any number of frequency bands.

In the transmit path, data processor 710 processes data to be transmitted and provides an analog output signal to transmitter 730. Within transmitter 730, the analog output signal is amplified by an amplifier (Amp) 732, filtered by a lowpass filter 734 to remove images caused by digital-to-analog conversion, amplified by a VGA 736, and upconverted from baseband to RF by a mixer 738. The upconverted signal is filtered by a filter 740, further amplified by a driver amplifier 742 and a power amplifier 744, routed through switches/duplexers 746, and transmitted via an antenna 748. By way of example, power amplifier 744 may comprise power amplifier 106 of FIG. 1 and/or power amplifier 214 of FIG. 2.

In the receive path, antenna 748 receives signals from base stations and/or other transmitter stations and provides a received signal, which is routed through switches/duplexers 746 and provided to receiver 750. Within receiver 750, the received signal is amplified by an LNA 752, filtered by a bandpass filter 754, and downconverted from RF to baseband by a mixer 756. The downconverted signal is amplified by a VGA 758, filtered by a lowpass filter 760, and amplified by an amplifier 762 to obtain an analog input signal, which is provided to data processor 710.

FIG. 7 shows transmitter 730 and receiver 750 implementing a direct-conversion architecture, which frequency converts a signal between RF and baseband in one stage. Transmitter 730 and/or receiver 750 may also implement a super-heterodyne architecture, which frequency converts a signal between RF and baseband in multiple stages. A local oscillator (LO) generator 770 generates and provides transmit and receive LO signals to mixers 738 and 756, respectively. A phase locked loop (PLL) 772 receives control information from data processor 710 and provides control signals to LO generator 770 to generate the transmit and receive LO signals at the proper frequencies.

FIG. 7 shows an exemplary transceiver design. In general, the conditioning of the signals in transmitter 730 and receiver 750 may be performed by one or more stages of amplifier, filter, mixer, etc. These circuits may be arranged differently from the configuration shown in FIG. 7. Furthermore, other circuits not shown in FIG. 7 may also be used in transmitter 730 and receiver 750. For example, transmitter 730 may include a gain unit (e.g., post-DPD gain unit 208), an RF gain index (e.g., RF gain index 212), and/or a DPD unit (e.g., DPD unit 202). Moreover, device 700 may include one or more matching circuits for matching various active circuits in FIG. 7. Some circuits in FIG. 7 may also be omitted. All or a portion of transceiver 720 may be implemented on one or more analog integrated circuits (ICs), RF ICs (RFICs), mixed-signal ICs, etc. For example, amplifier 732 through power amplifier 744 in transmitter 730 may be implemented on an RFIC. Driver amplifier 742 and power amplifier 744 may also be implemented on another IC external to the RFIC.

Data processor 710 may perform various functions for wireless device 700, e.g., processing for transmitted and received data. Memory 712 may store program codes and data for data processor 710. More specifically, memory 712 may store program codes for execution by data processor 710 to carry out the methods described herein. Data processor 710 may be implemented on one or more application specific integrated circuits (ASICs) and/or other ICs.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method, comprising:
   calculating input voltage values and bias voltage values of a power amplifier for each desired output voltage value of the power amplifier at a desired compression point, wherein the input voltage values comprises analog input voltage values; and
   calibrating a radio-frequency (RF) device including the power amplifier based on the calculated input and bias voltage values by adjusting one or more of the bias voltage and the input voltage values to provide linear scaling across a plurality of desired compression points.

2. The method of claim 1, wherein calibrating comprises:
   sensing a plurality of in-phase and quadrature (IQ) samples conveyed by the power amplifier at a plurality of input voltages and bias voltages conveyed to the power amplifier;
   generating a plurality of amplitude modulation-to-amplitude modulation (AM-AM) curves from the plurality of sensed IQ samples;
   determining a relationship among the input voltage, the bias voltage, and the output voltage based on the desired compression point on each curve for one or more power amplifier control technologies; and
   determining, based on the relationship, two of the input voltage, the bias voltage, and the output voltage to reach the target compression point based on a known value for one of the input voltage, bias voltage, and the output voltage.

3. The method of claim 2, further comprising
   generating additional AM-AM curves based on linearly scaling across a line at a target compression for each AM-AM curve.

4. The method of claim 2,
   wherein, determining based on the relationship, comprises determining the input voltage and the bias voltage to reach the desired compression point based on a desired output voltage.

5. The method of claim 2,
   wherein determining a relationship comprises determining a relationship among the input voltage, the bias voltage, and the output voltage based on the desired compression point on each curve for one or more power amplifier control technologies.

6. The method of claim 2,
   wherein determining a relationship comprises generating a three-dimensional plot including the plurality of AM-AM curves relative to the input voltage, the output voltage, and the bias voltage, wherein each curve includes a desired compression point.

7. The method of claim 1, further comprising:
   applying digital pre-distortion (DPD) values to the input voltage of the power amplifier; and
   measuring a value of the output voltage after applying the DPD values.

8. The method of claim 7, further comprising
   calculating the DPD values based on in-phase and quadrature (IQ) samples.

9. The method of claim 8,
   wherein calculating the DPD values comprises calculating amplitude modulation-to-amplitude modulation (AM-AM) values and amplitude modulation-to-phase modulation (AM-PM) values.

10. A method, comprising:
    sensing a plurality of in-phase and quadrature (IQ) samples conveyed by a power amplifier at at least one input voltage of an analog input of the power amplifier and at least one bias voltage conveyed to the power amplifier;
    generating a plurality of amplitude-to-amplitude (AM-AM) curves from the plurality of sensed IQ samples;
    determining a relationship among the at least one input voltage, the at least one bias voltage, and least one output voltage based on a target compression point associated with one of one or more power amplifier control technologies on each curve for each of the one or more power amplifier control technologies, the relationship being determined by adjusting one or more of the bias voltage and the input voltage values to provide linear scaling across a plurality of desired compression points associated with a respective power amplifier control technology; and
    determining, based on the relationship, two of the at least one input voltage, the at least one bias voltage, and the at least one output voltage to reach the target compression point based on a known value for one of the at least one input voltage, the at least one bias voltage, and the at least one output voltage.

11. The method of claim 10,
    wherein determining based on the relationship comprises determining the at least one input voltage and the at least one bias voltage to reach the target compression point based on a desired value of the at least one output voltage.

12. The method of claim 10, wherein determining a relationship comprises
    generating a three-dimensional plot including the plurality of AM-AM curves relative to the at least one input voltage, the at least one output voltage, and the at least one bias voltage, wherein each curve includes the target compression point.

13. The method of claim 10, wherein determining a relationship comprises
    determining a relationship among the at least one input voltage, the at least one bias voltage, and the at least one output voltage based on target compression point on each curve for one or more power amplifier control technologies.

14. The method of claim 10, further comprising generating additional AM-AM curves based on linearly scaling across a line including one target compression for each AM-AM curve.

15. The method of claim 10, further comprising storing data related to the relationship.

16. The method of claim 10, further comprising adjusting one of the at least one input voltage and the at least one bias voltage based on the relationship to generate a desired output voltage at the target compression point.

17. A device, comprising:
a power amplifier configured to receive an input voltage and a bias voltage and convey an output voltage, wherein the input voltage is at an analog input of the power amplifier; and
a processor coupled to an output of the power amplifier and configured to:
  sense a plurality of in-phase and quadrature (IQ) samples conveyed by the power amplifier at a plurality of input voltages and bias voltages conveyed to the power amplifier;
  generate a plurality of amplitude-to-amplitude (AM-AM) curves from the plurality of sensed IQ samples;
  determine a relationship among the input voltage, the bias voltage, and the output voltage based on a target compression point associated with one of one or more power amplifier control technologies on each curve for each of the one or more power amplifier control technologies, the relationship being determined by adjusting one or more of the bias voltage and the input voltage values to provide linear scaling across a plurality of desired compression points associated with a respective power amplifier control technology; and
  determine, based on the relationship, two of the input voltage, the bias voltage, and the output voltage to reach the target compression point based on a known value for one of the input voltage, bias voltage, and the output voltage.

18. The device of claim 17, wherein the processor is further configured to generate additional AM-AM curves based on linearly scaling across a line including a target compression for each AM-AM curve.

19. The device of claim 17, wherein the processor is further configured to determine a bias voltage and an input voltage for a target compression point at each desired output voltage of a plurality of output voltages.

20. The device of claim 17, wherein the processor is configured to convey one or more control signals for controlling one of the input voltage and the bias voltage.

21. The device of claim 17, wherein the processor comprises memory for storing information related to the relationship.

22. The device of claim 17, wherein the processor is further configured to calculate digital pre-distortion (DPD) values based on the IQ samples.

23. The device of claim 22, wherein the processor is configured to calculate amplitude modulation-to-amplitude modulation (AM-AM) values and amplitude modulation-to-phase modulation (AM-PM) values to calculate the DPD values.

24. The device of claim 17, wherein the processor is further configured to adjust at least one of the input voltage and the bias voltage based on the relationship to generate a desired output voltage at the target compression point.

25. A device, comprising:
means for calibrating a radio-frequency (RF) device by calculating input voltage values and bias voltage values of a power amplifier for each desired output voltage value of the power amplifier to generate a desired compression point, wherein the input voltage values comprises analog input voltage values;
means for applying digital pre-distortion (DPD) values to the input voltage of the power amplifier, the DPD values being determined by adjusting one or more of the bias voltage and the input voltage values to provide linear scaling across a plurality of desired compression points; and
means for measuring a value of the output voltage after applying the DPD values.

26. A device, comprising:
means for sensing a plurality of in-phase and quadrature (IQ) samples conveyed by a power amplifier at at least one input voltage of an analog input of the power amplifier and at least one bias voltage conveyed to the power amplifier;
means for generating a plurality of amplitude-to-amplitude (AM-AM) curves from the plurality of sensed IQ samples;
means for determining a relationship among the at least one input voltage, the at least one bias voltage, and at least one output voltage based on a target compression point associated with one of one or more power amplifier control technologies on each curve for each of the one or more power amplifier control technologies, the relationship being determined by adjusting one or more of the bias voltage and the input voltage values to provide linear scaling across a plurality of desired compression points associated with a respective power amplifier control technology; and
means for determining, based on the relationship, two of the at least one input voltage, the at least one bias voltage, and the at least one output voltage to reach the target compression point based on a known value of one of the at least one input voltage, the at least one bias voltage, and the at least one output voltage.

27. The method of claim 1, wherein the RF device is calibrated to operate at the desired compression point.

* * * * *